United States Patent
He et al.

(10) Patent No.: US 12,020,917 B2
(45) Date of Patent: *Jun. 25, 2024

(54) SPUTTER TARGET MAGNET

(71) Applicant: Taiwan Semiconductor Manufacturing Co., Ltd., Hsin-Chu (TW)

(72) Inventors: Ming-Jie He, Hsin-Chu (TW); Shawn Yang, Hsin-Chu (TW); Szu-Hsien Lo, Hsin-Chu (TW); Shuen-Liang Tseng, Hsinchu (TW); Wen-Cheng Cheng, Hsinchu (TW); Chen-Fang Chung, Zhubei (TW); Chia-Lin Hsueh, Zhubei (TW); Kuo-Pin Chuang, Xinfeng Township (TW)

(73) Assignee: Taiwan Semiconductor Manufacturing Co., Ltd., Hsin-Chu (TW)

(*) Notice: Subject to any disclaimer, the term of this patent is extended or adjusted under 35 U.S.C. 154(b) by 196 days.

This patent is subject to a terminal disclaimer.

(21) Appl. No.: 17/710,565

(22) Filed: Mar. 31, 2022

(65) Prior Publication Data
US 2022/0223391 A1   Jul. 14, 2022

Related U.S. Application Data

(63) Continuation of application No. 15/940,609, filed on Mar. 29, 2018, now Pat. No. 11,322,338.
(Continued)

(51) Int. Cl.
*H01J 37/34* (2006.01)
*C23C 14/35* (2006.01)

(52) U.S. Cl.
CPC .......... *H01J 37/3452* (2013.01); *C23C 14/35* (2013.01); *H01J 37/3405* (2013.01); *H01J 37/3417* (2013.01)

(58) Field of Classification Search
CPC ............... H01J 37/3452; H01J 37/3405; H01J 37/3417; C23C 14/35
See application file for complete search history.

(56) References Cited

U.S. PATENT DOCUMENTS

| 5,858,180 A | 1/1999 | Hsu |
| 6,299,740 B1 | 10/2001 | Hieronymi |

(Continued)

FOREIGN PATENT DOCUMENTS

| CN | 2519391 Y | 10/2002 |
| CN | 104651786 A | 5/2015 |

(Continued)

OTHER PUBLICATIONS

Official Action dated Jul. 12, 2019, in corresponding Taiwan Patent Application No. 10820663140.

*Primary Examiner* — John J Brayton
(74) *Attorney, Agent, or Firm* — Duane Morris LLP

(57) ABSTRACT

A method for modifying magnetic field distribution in a deposition chamber is disclosed. The method includes the operations of providing a target magnetic field distribution, removing a first plurality of fixed magnets in the deposition chamber, replacing each of the first plurality of fixed magnets with respective ones of a second plurality of magnets, performing at least one of adjusting a position of at least one of the second plurality of the magnets, and adjusting a size of at least one of the second plurality of magnets, adjusting a magnetic flux of at least one of the second plurality of magnets, measuring the magnetic field distribution in the deposition chamber, and comparing the measured magnetic field distribution in the deposition chamber with the target magnetic field distribution.

20 Claims, 10 Drawing Sheets

Related U.S. Application Data

(60) Provisional application No. 62/552,947, filed on Aug. 31, 2017.

(56) References Cited

U.S. PATENT DOCUMENTS

| | | |
|---|---|---|
| 8,778,145 B2 | 7/2014 | Watanabe |
| 9,347,129 B2 | 5/2016 | Foo |
| 11,322,338 B2 * | 5/2022 | He .................. H01J 37/3405 |
| 2004/0050690 A1 | 3/2004 | Green |
| 2007/0108041 A1 | 5/2007 | Guo |
| 2009/0026067 A1 | 1/2009 | Shiina |
| 2009/0218218 A1 | 9/2009 | Kutsuzawa |
| 2009/0277779 A1 | 11/2009 | Sasaki |
| 2011/0259733 A1 | 10/2011 | Watanabe |

FOREIGN PATENT DOCUMENTS

| | | |
|---|---|---|
| JP | 11050249 A | 2/1999 |
| TW | 278191 B | 6/1996 |

* cited by examiner

SPUTTER TARGET MAGNET

CROSS-REFERENCE TO RELATED APPLICATIONS

The present application is a continuation of U.S. patent application Ser. No. 15/940,609, filed on Mar. 29, 2018, which claims priority to U.S. Provisional Patent Application No. 62/552,947, filed on Aug. 31, 2017, each of which is incorporated by reference herein in its entirety.

BACKGROUND

Emerging applications in micro-electro-mechanical systems (MEMS), CMOS image sensors and packaging technologies, such as through-silicon vias (TSV) are driving Physical Vapor Deposition (PVD) development on films like Aluminum Nitride (AlN), Indium Tin Oxide (ITO), Aluminum Oxide ($Al_2O_3$) and Germanium (Ge).

There are existing metallization systems in the semiconductor industry. With deposition capabilities spanning front end metallization like cobalt and tungsten, aluminum and copper interconnect, as well as packing applications like under bump metallization, a vast majority of microchips made in the last 20 years have been created using one of the existing systems across the globe. The existing systems' abilities to deposit a wide variety of ultra-pure films with tight control over film thickness, superior bottom coverage and high conformality have enabled the fabrication of leading edge devices.

With existing systems still in production, with many in their original configuration, there are a number of product improvements available which provide improved process performance and tool productivity. For example, throughput bottlenecks at the Cool Down chamber can be eliminated by conversion of Chamber A from Pass Thru to Cool Down. Wafer placement errors can be eliminated with easy local center finding (EZ LCF), while improving the performance for clamped processes with tight edge exclusions and eliminating stack-up errors related to multi-chamber process sequences. In addition, chamber upgrades are available for many of the chambers, including TxZ (a TiN heater for wafer heating process), to improve on-wafer uniformity and reduce maintenance.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EXEMPLARY EMBODIMENTS

Figure 1:
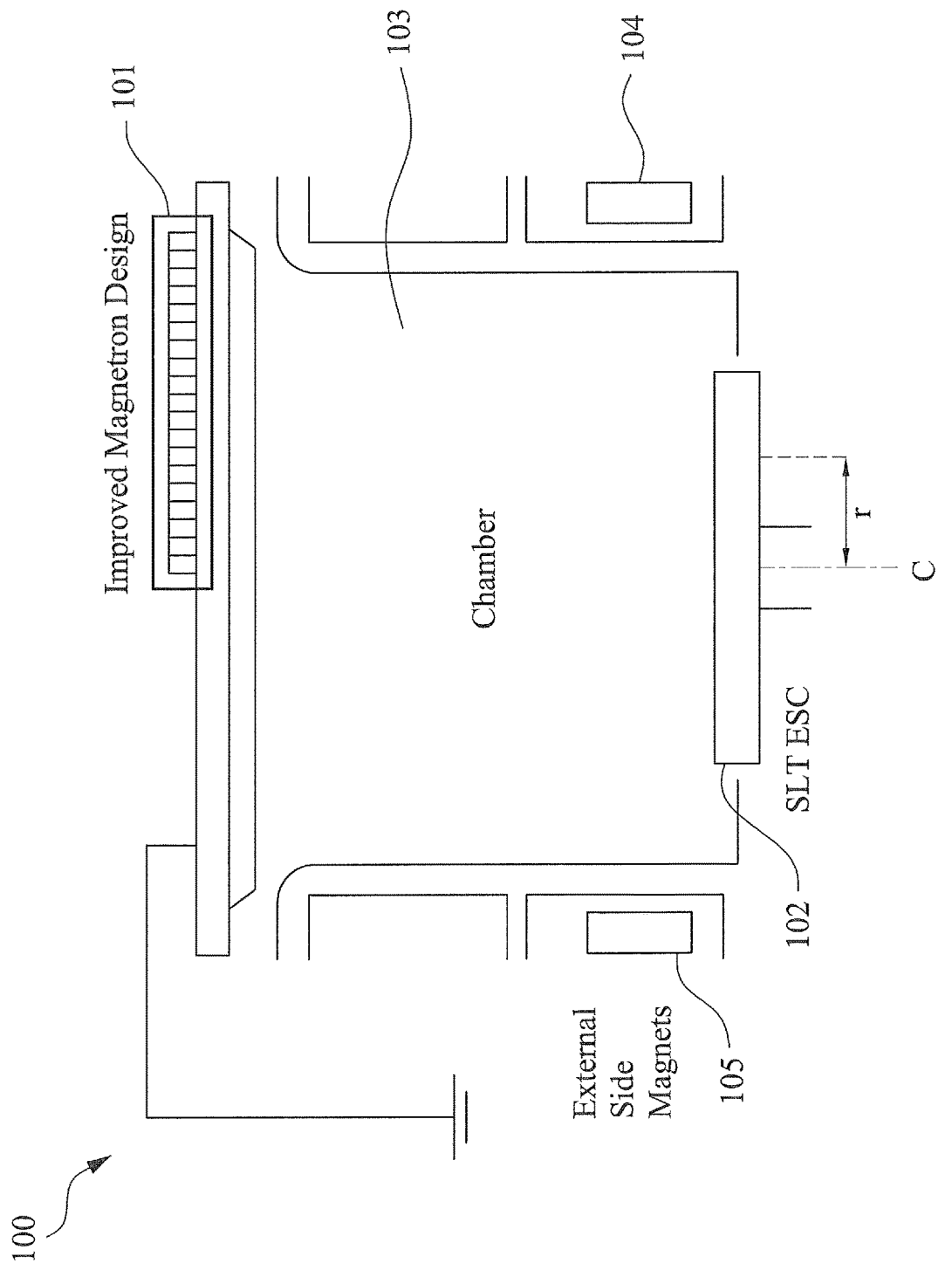
FIG. 1 is a schematic illustration of a process chamber, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a schematic illustration of a process chamber, in accordance with some embodiments. According to some embodiments, the process chamber 100 includes a rotating magnetron 101 located on the top of the chamber 103, in which objects are positioned for deposition on the sides of the chamber 103. External side magnets 104 and 105 are located on the exterior of the chamber 103. On the bottom of the chamber 103, target 102 with a radius r is located at the center of the bottom. The external side magnets 104 and 105, together with the rotating magnetron 101 on the top of the chamber 103, generate a magnetic field inside the chamber to facilitate the deposition of material from an object located inside the chamber 103. More details regarding the structure of the rotating magnetron 101 and the target 102 will be discussed in the following paragraphs.

Figure 2:
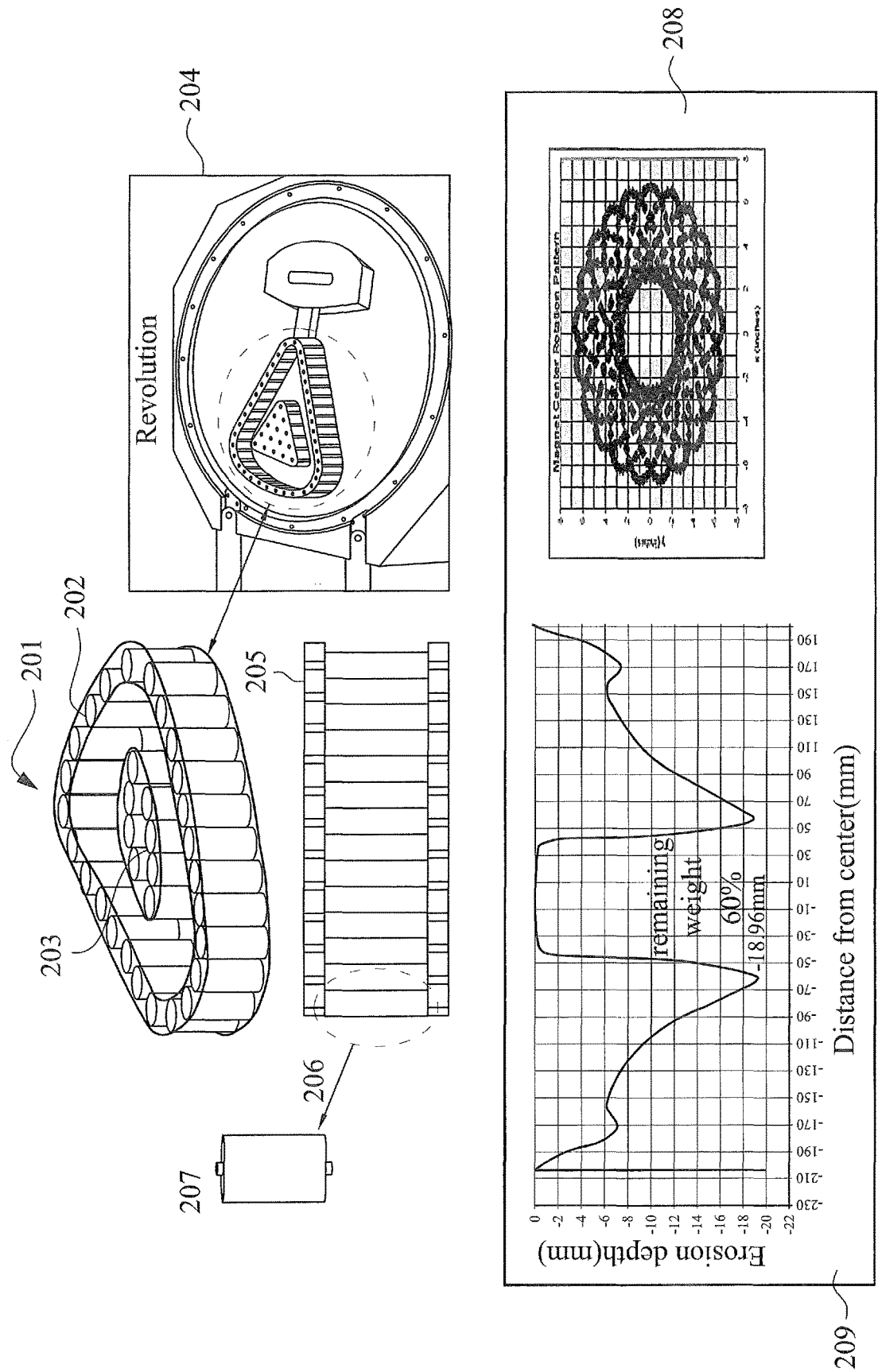
FIG. 2 illustrates various features of the process chamber and corresponding magnets and magnetic fields, in accordance with some embodiments.

FIG. 2 illustrates various features of a process chamber and corresponding magnets and magnetic fields, in accordance with some embodiments, 201 is a perspective view of the rotating magnetron 101, which includes an external component 202 and an internal component 203. Both the external and the internal components 202 and 203 include a plurality of magnets. According to some embodiments, the magnets of internal component 202 all have their north pole pointing in the opposite direction of the north pole of the magnets of the external component 203. According to some embodiments, the magnets of internal component 202 all have their north pole pointing up, and the north pole of the magnets of the external component 203 points down. View 204 is a perspective view of the rotating magnetron with a counter weight rotating in a chamber, with the target at the bottom. View 205 is a side view of the rotating magnetron, and view 206 is one of the magnets in the magnet array. View 207 shows the magnet 206 as a standalone magnet, in accordance with some embodiments.

The rotating magnetron 101 and the external side magnets 104 and 105 generate a magnetic field 208. Due to the rotating nature of the magnetron and the geometry of the chamber, the magnetic field 208 is formed in the shape of a ring, which means that the magnetic field is relatively weak inside a first radius (i.e., inside the ring) and outside a second radius (i.e., outside the ring). Graph 209 is an illustration of the erosion depth of the target as a function of the radius from center (C) as shown in FIG. 1. As discussed earlier, since the magnetic field inside a first radius is relatively weak, no significant erosion is observed inside the radius of 40 mm, for example. As the radius increase, the magnetic field reaches a peak at radius 60 mm, and the strong magnetic field creates a strong erosion at radius 60 mm, the corresponding erosion depth reaches 19 mm at radius 60 mm, in the example shown in graph 209. Then the magnetic field gradually decreases outside radius 60 mm, and the corresponding erosion also decreases following the magnetic field.

Figure 3:
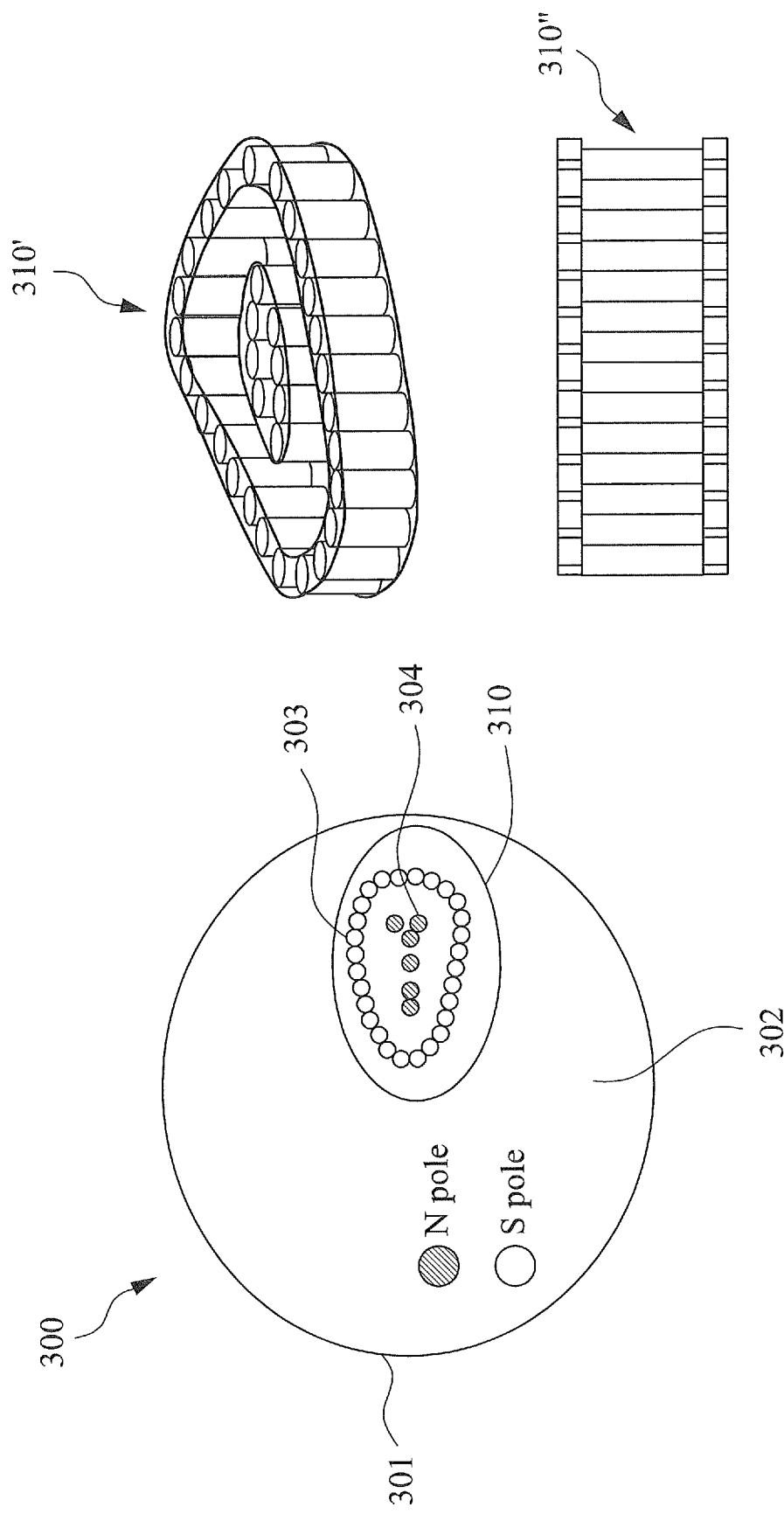
FIG. 3 is a schematic illustration the distribution of the process chamber magnets, in accordance with some embodiments.

FIG. 3 is a schematic illustration of a distribution of the process chamber magnets, in accordance with some embodiments. According to some embodiments, 300 is a top view of the process chamber, 301 is the side wall of the chamber and 302 is the bottom of the chamber on which a target is located. The rotating magnetron 310 include two groups of magnets, 303 is an external array of magnets and 304 is an internal array of magnets. According to some embodiments, the north poles of the internal array of magnets point upward, and the north poles of the external array of magnets point downward. Similar to prior discussions, 301' is a perspective view of the rotating magnetron 310, and 310" is a side view.

Figure 4:
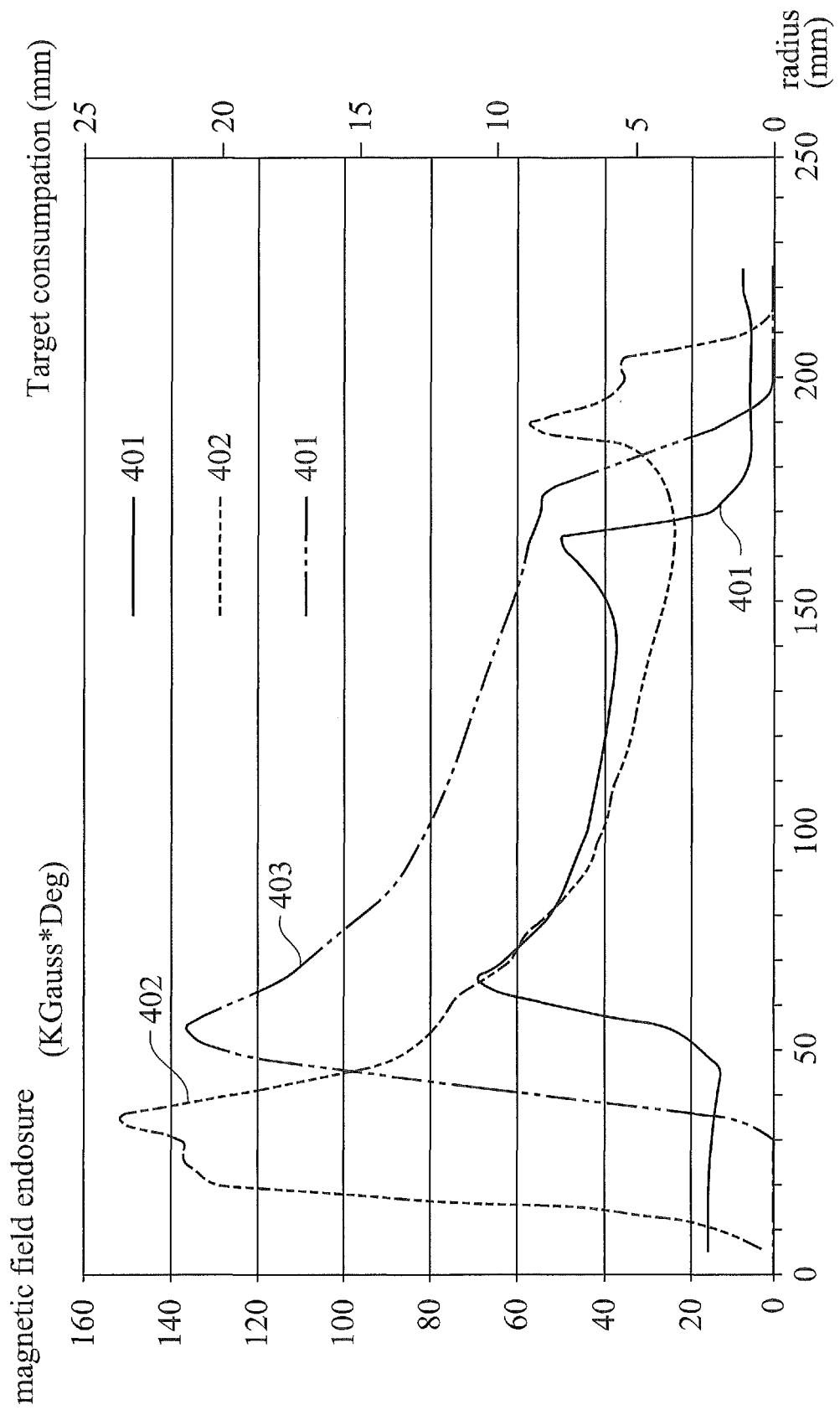
FIG. 4 is a schematic illustration of the magnetic field as a function of the radius of the target and the consumption of the target as a function of the radius of the target, in accordance with some embodiments.

FIG. 4 is a schematic illustration of the magnetic field as a function of the radius of the target and the consumption of the target as a function of the radius of the target, in accordance with some embodiments. According to some embodiments, the x-axis is radius in millimeters, the left y-axis is the magnetic flux in KGauss·Deg, and the right y-axis is target erosion in millimeters. The magnetic flux is measure of the strength of the magnetic field.

According to some embodiments, curve 401 is a curve designating the magnetic flux of the north pole, and curve 402 is a curve designating the magnetic flux of the south pole. In physics, specifically electromagnetism, the magnetic flux (often denoted Φ or ΦB) through a surface is the surface integral of the normal component of the magnetic field B passing through that surface. The SI base unit, according to International System of Units, of magnetic flux is the weber (Wb) (in derived units: volt-seconds). The CGS (centimetre-gram-second) unit of magnetic flux is the Maxwell. Magnetic flux is usually measured with a fluxmeter, which contains measuring coils and electronics, that can evaluate the change of voltage in the measuring coils to calculate the magnetic flux.

The curve 403 is a curve designating the target erosion. According to some embodiments, a subtraction of the curves 402 and 403 produces the overall strength of the magnetic field generated by the magnetron inside the chamber. More details regarding the overall strength of the magnetic field will be discussed in the following paragraphs.

Figure 5:
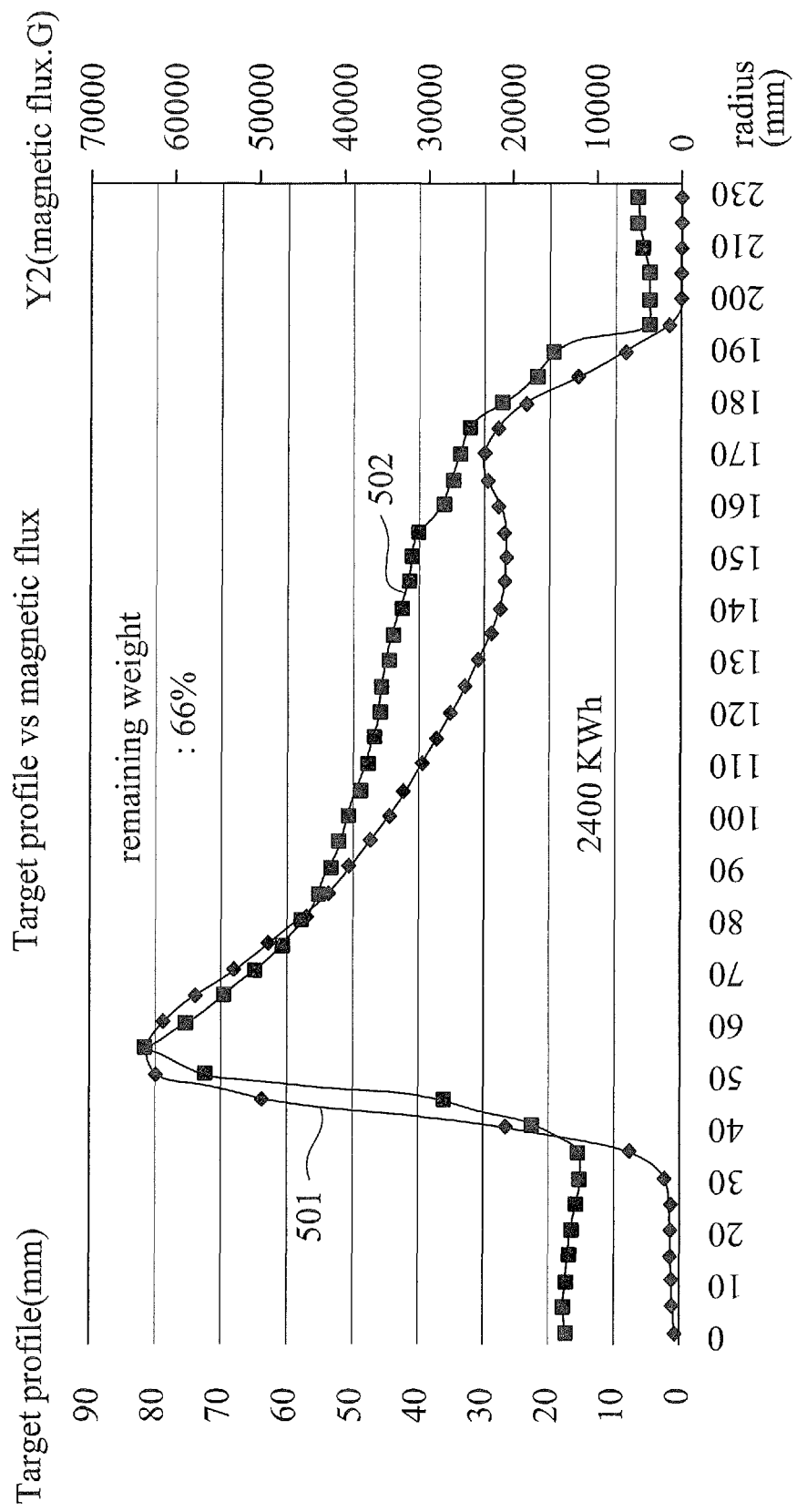
FIG. 5 is a schematic illustration of the magnetic field and target profile as functions of the radius of the target, in accordance with some embodiments.

FIG. 5 is a schematic illustration of the magnetic field and target profile as functions of the radius of the target, in accordance with some embodiments. According to some embodiments, the x-axis is the radius from the center of the chamber in millimeters. The y-axis on the left, which is associated with the curve 502, is a target profile, also in millimeters, designating the consumed thickness of the target material. The y-axis on the right, which is associated with curve 501, is the magnetic flux in units of a Weber. Magnetic flux is the product of the average magnetic field times the perpendicular area that it penetrates: Φ=B·S=BS cos θ, where B is vector of the magnetic field and B is the scalar amplitude of the magnetic field, S is the vector area of the vector magnetic field B, and S is the scalar area of the magnetic field, θ is the angle between the magnetic field lines and normal (perpendicular) to S. It is a quantity of convenience in the statement of Faraday's Law and in the discussion of objects like transformers and solenoids. As discussed in FIG. 2 above, the magnetic field generated by the rotating magnetron before the adjustment of the magnets is measured by the magnetic flux curve 501. As illustrated by curve 501, the magnetic flux is relatively weak near the center of the chamber, and reaches a peak near the radius of 50 mm~60 mm, then gradually decreases until it reaches the edge of the chamber. The corresponding target profile curve 502 follows the trend of the magnetic flux curve 501. As discussed above, the target profile is the amount of material consumed, measured in millimeters, during the deposition process. As illustrated in FIG. 5, the target profile curve 502 also reaches a peak when the magnetic flux curve 501 reaches a peak, and the target profile curve 502 gradually decreases following the decreasing trend of the magnetic flux curve 501. More details of the relationship between the target profile and the magnetic flux will be discussed in the following paragraphs. When the remaining weight of the target is 66%, the target at the radius of 55 mm-60 mm is already more than 80 mm consumed, which requires replacement. As a result, approximately 66% of the target is wasted.

Figure 6:
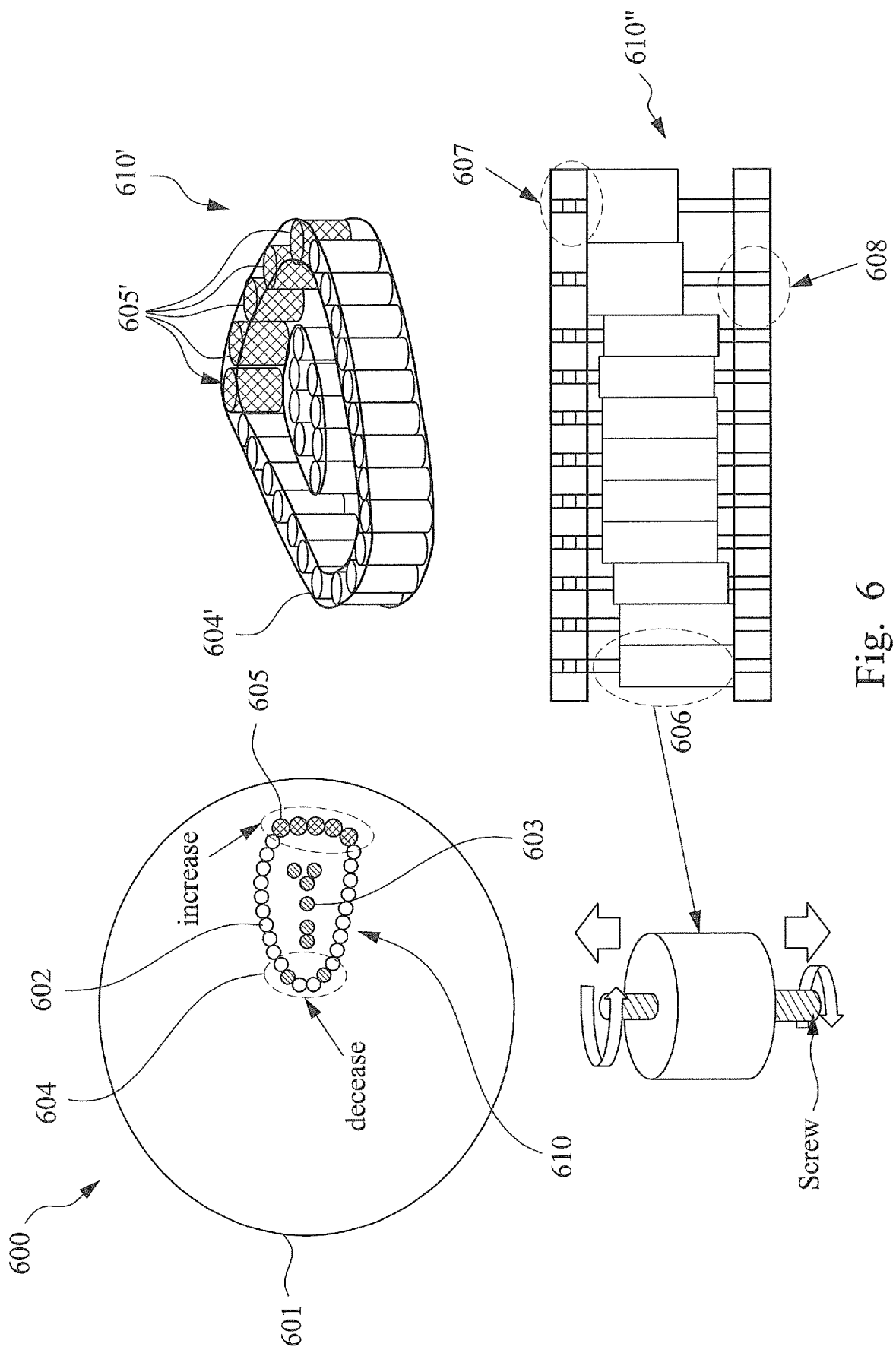
FIG. 6 is a schematic illustration of adjustable magnets in the modified configuration of the process chamber, in accordance with some embodiments.

FIG. 6 is a schematic illustration of adjustable magnets of a process chamber, in accordance with some embodiments. According to some embodiments, 600 is a top view of the process chamber, 601 is the side wall of the process chamber, 610' is the rotating magnetron which includes an internal array of magnets 603 and an external array of magnets 602. As used herein, the term "adjustable magnet" means, according to some embodiments, for example, replacing an existing magnet with another magnet with at least one of following different parameters: diameter, height, magnetic field strength, magnetic field distribution, and material; according to some other embodiments, for example, changing the height of the magnet by adding additional metal plates on the top and/or bottom of the magnet, or by removing metal from the top and/or the bottom of the magnet; according to some other embodiments, for example, changing the diameter of the magnet by adding concentric metal rings to the magnet, or by removing existing concentric metal rings from the magnet; according to some other embodiments, for example, when the magnet is electric magnet, changing the magnetic field distribution and strength by changing the amplitude, frequency and/or direction of the electric current flowing into the magnet. A person of ordinary skill in the art understands that there are other ways to adjust the physical parameters and properties of magnets, the above mentioned examples are not meant to limit the scope of "adjustable magnet."

In order to adjust the magnetic field generated by the magnetron inside the chamber, a first group of magnets 604 in the external array of magnets 602 are selected to be modified to reduce their magnetic field. And a second group of magnets 605 in the external array of magnets 602 are selected to be modified to increase their magnetic field. In the side view of the magnetron 610', the second group of magnets 605 are designated as 605', and the first group of magnets 604 are designated as 604'. According to some embodiments, there are a plurality of upper fixing spots 607 located on the top of the magnetron, and a plurality of corresponding lower fixing spots 608 located on the bottom of the magnetron. Each individual magnet 606 can be fixed to a different horizontal location with a different pair of upper fixing spot 607 and lower fixing spot 608. As will be discussed in more detail in FIG. 7, each magnet 606 includes a upper connector and a lower connector. According to some embodiments, the upper connectors and the lower connectors are screws, and the upper and lower fixing spots are matching screw holes. According to some embodiments, each individual magnet can be fixed to a different horizontal location by screwing the magnet to a different pair of upper and lower fixing spots.

According to some embodiments, in the side view 610" of the magnetron, selected magnets are adjusted, either in height, in radius, in location, or in volume to modify their corresponding magnetic field. 606 is a detailed view of an individual magnet, which will be discussed in further detail below with reference to FIG. 7.

According to some embodiments, each selected magnet is adjusted and then the overall magnetic field of the magnetron is measured. One purpose of such adjustment is to eliminate the sharp peak observed in the magnetic flux curve 501 and the corresponding peak on the target profile curve 502. After such adjustment, relatively flat curves are achieved which will be discussed in further detail below with reference to FIG. 8. According to some embodiments, the consumption area of the target can also be increased by adjusting the magnetic field of the magnetron. The consumption area is the area on the target which are consumed during the deposition process, a larger consumption area increases the utility rate of the target and reduces waste of the target material. According to some embodiments, measurement of the magnetic field is conducted after each round of magnet adjustments. According to some embodiments, feedback control is provided for the next round of adjustment of the magnets to achieve the design magnetic field. According to some embodiments, feedback control is implemented by comparing the measured magnetic field distribution with the designed magnetic field distribution, then calculating the difference between measured magnetic field distribution and the designed magnetic field distribution, and then providing information or guidance regarding how to change, or adjust, each individual magnet to achieve the desired magnetic field distribution. According to some embodiments, the above mentioned feedback control is achieved with automated processes assisted by computer software and hardware. Persons or ordinary skill in the art can determine without undue experimentation how to adjust one or more physical parameters of the magnets discussed to achieve a desired magnetic field distribution.

Figure 7:
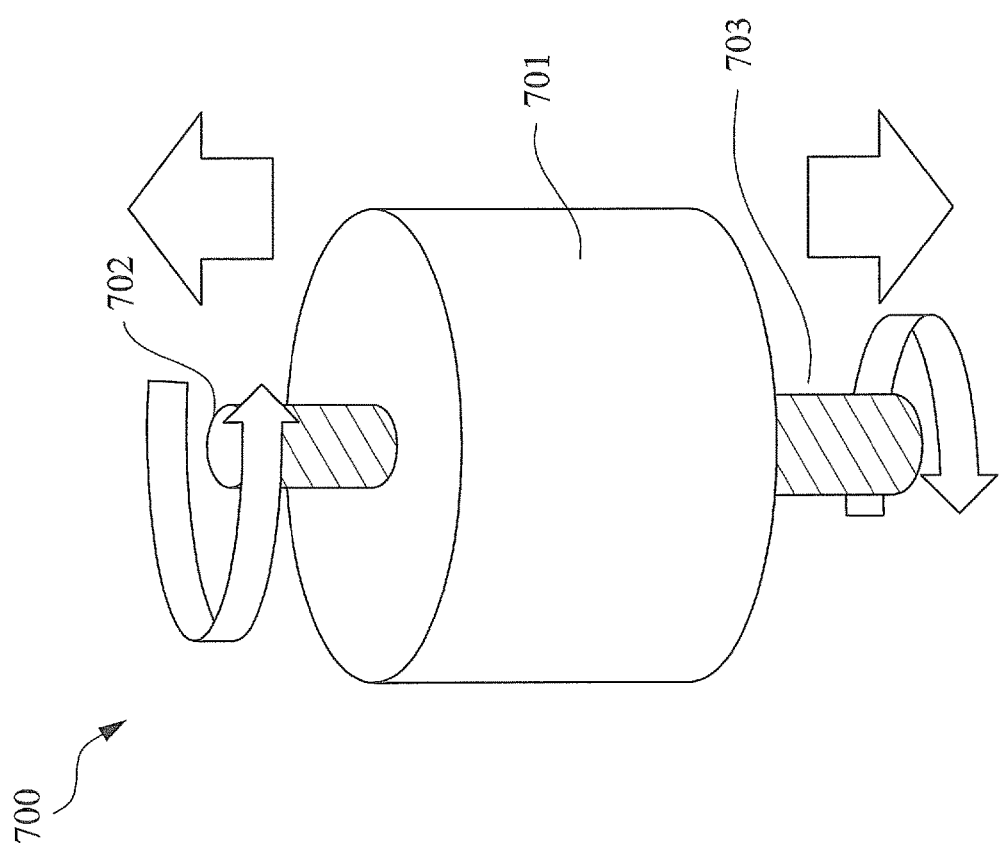
FIG. 7 is a schematic illustration of an adjustable magnet, in accordance with some embodiments.

FIG. 7 is a perspective view of an adjustable magnet, in accordance with some embodiments. According to some embodiments, the magnet 700 includes a magnet body 701, an upper connector 702 and a lower connector 703. According to some embodiments, different heights, radii and/or volumes can be selected for the magnet body 701 to vary the overall magnetic field produced by the magnet 700. According to some embodiments, the upper and lower connectors 702 and 703 can be adjusted to fix the magnet body 701 at different positions to vary the overall magnetic field. According to some embodiments, the magnet body 701 can be fixed at different elevations in the chamber by adjusting screws or fasteners (not shown) in the upper and lower connectors 702 and 703. According to some embodiments, the magnet body 701 can be fixed at different horizontal locations by adjusting screws, for example, in the upper and lower connectors 702 and 703. According to some embodiments, there are a top fastener and a lower fastener for fastening the magnet to the magnetron. According to some embodiments, the top fastener is a screw. According to some embodiments, the bottom fastener is a screw. According to some embodiments, the magnet body 701 is an electromagnet, whose magnetic field can be adjusted and controlled by the direction and intensity of the electric current flowing into the coils inside the electro-magnet body 701. According to some embodiments, each magnet body 701 is an electrical magnet and is individually controlled by an electronic control circuit (not shown) that provides current to the electrical magnet. According to some embodiments, all magnet bodies in the magnetron are collectively controlled by a control circuit.

Figure 8:
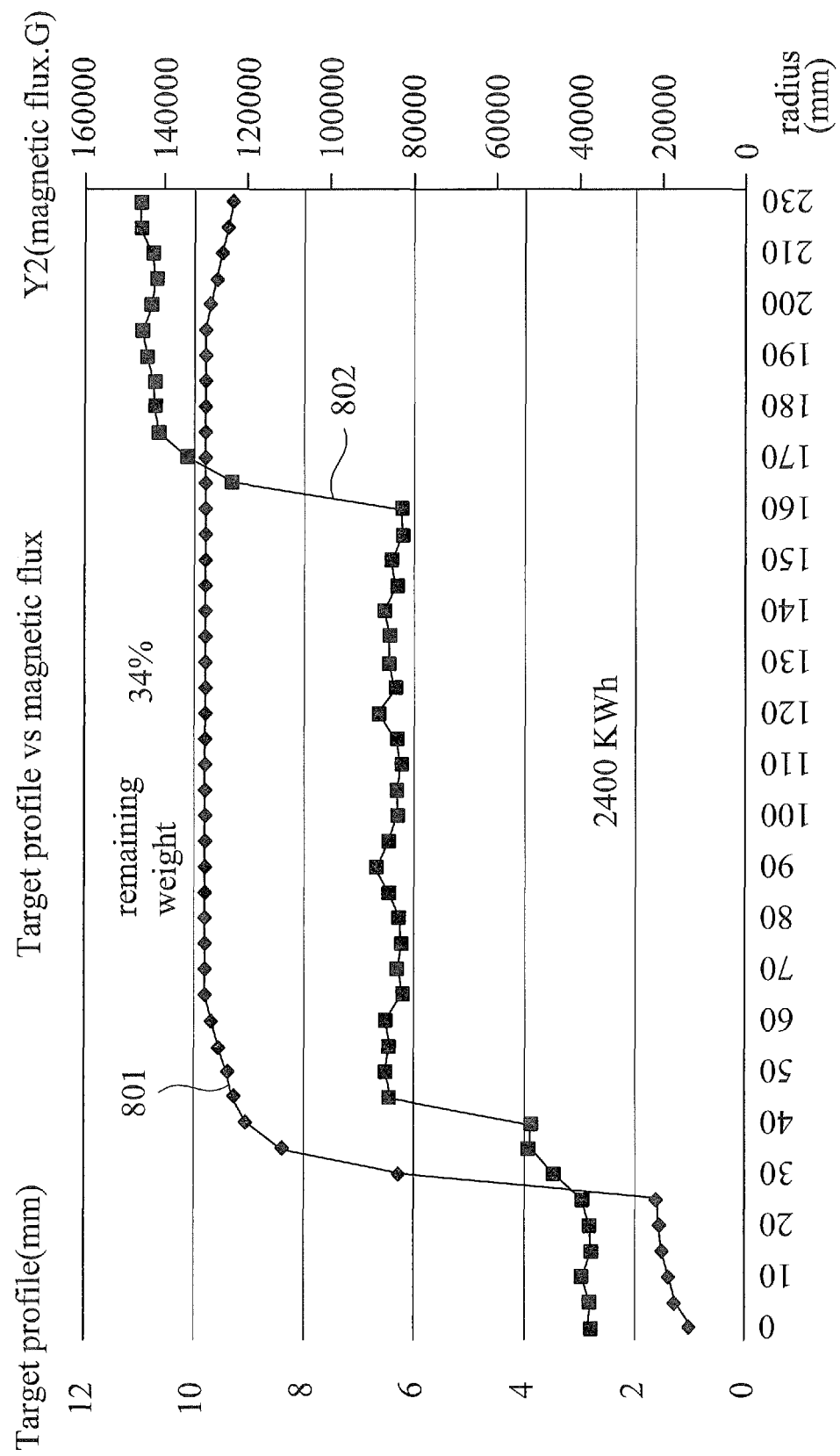
FIG. 8 is a schematic illustration of the target profile and magnet field as functions of the radius of the target in the process chamber, in accordance with some embodiments.

FIG. 8 is a schematic illustration of the target profile and magnet field as functions of the radius of the target in a process chamber, in accordance with some embodiments. The x-axis and the y-axes have the same scales and units as discussed above with respect to FIG. 5. According to some embodiments, the magnetron is modified by adjusting the corresponding magnets as discussed in the paragraphs above. As a result of such adjustment, the magnetic flux curve 801 does not bear a peak like that of curve 501 in FIG. 5. Neither does the magnetic flux curve 801 decrease sharply like that of 501. Instead, as illustrated in FIG. 8, the magnetic flux curve 801 stays at a relatively constant level almost all the way to the edge of the chamber. The peak in the corresponding target profile curve 802 is also eliminated as a result, and the target profile 802 reaches a first plateau when the magnetic flux approaches a constant level, followed by a second higher plateau near the edge of the chamber. When the remaining weight of the target is 34%, the target profile is still less than 12 mm consumed. Thus, a more efficient utilization of the target material is achieved by utilizing magnets of different sizes and configurations, as discussed above.

Figure 9:
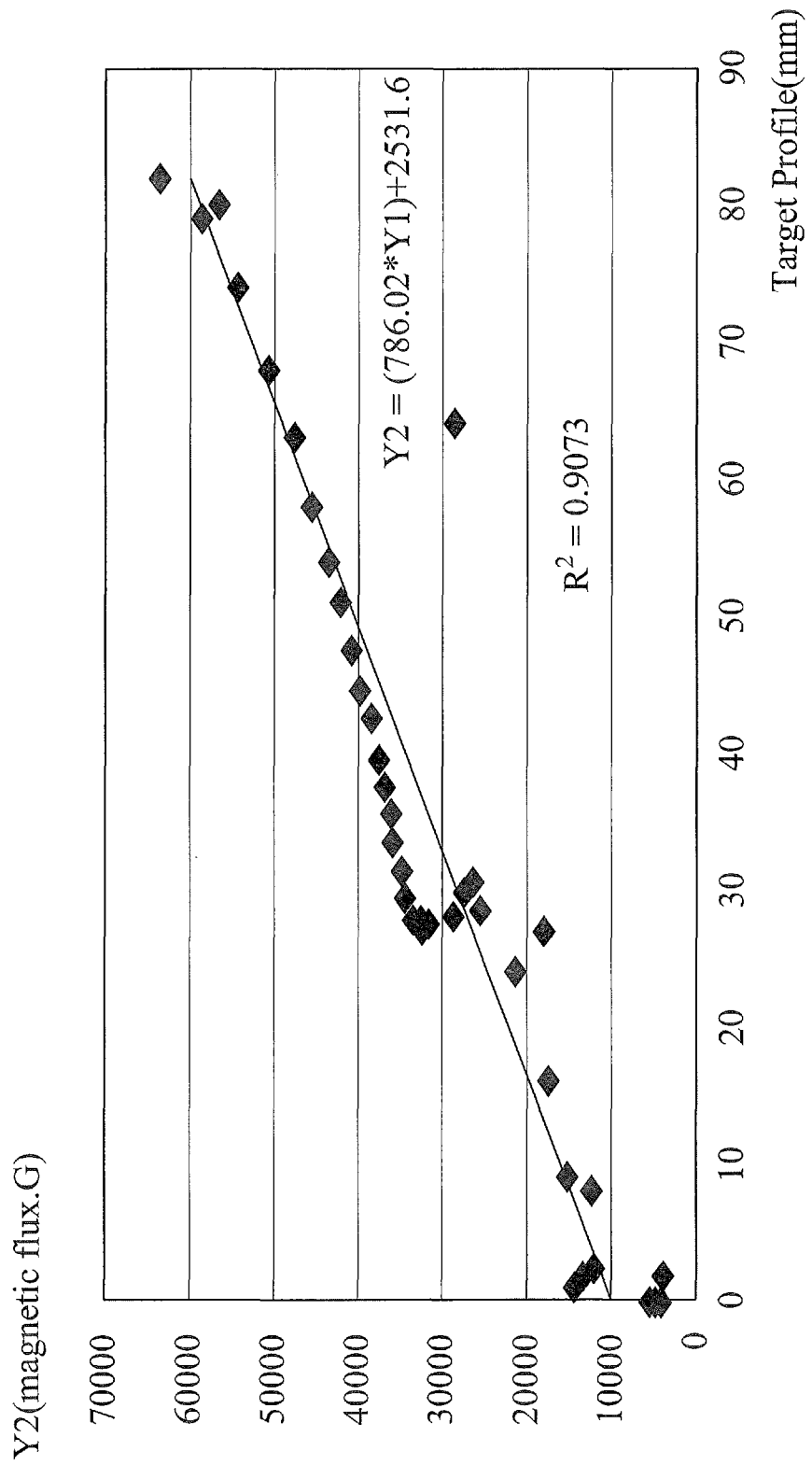
FIG. 9 is a schematic illustration of the relationship between the target profile and the magnetic field, in accordance with some embodiments.

FIG. 9 is a schematic illustration of the relationship between the target profile and the magnetic field, in accordance with some embodiments. FIG. 9 is a linear regression of a target profile and magnetic flux, which shows that the relationship between the target profile and magnetic flux is highly linear, with a $R^2$ value of 0.9073. In statistics, linear regression is an approach for modeling the relationship between a scalar dependent variable and one or more explanatory variables (or independent variables). $R^2$ is a statistical measure of how close the data are to the fitted regression line. It is also known as the coefficient of determination, or the coefficient of multiple determination for multiple regression. The $R^2$ is the percentage of the response variable variation that is explained by a linear model, or: $R^2$=Explained variation/Total variation. R-squared is always between 0 and 1: 0 indicates that the model explains none of the variability of the response data around its mean; 1 indicates that the model explains all the variability of the response data around its mean. In general, the higher the $R^2$, the better the model fits your data. Accordingly, a $R^2$ value of 0.9073 means a very good linear fit.

Figure 10:
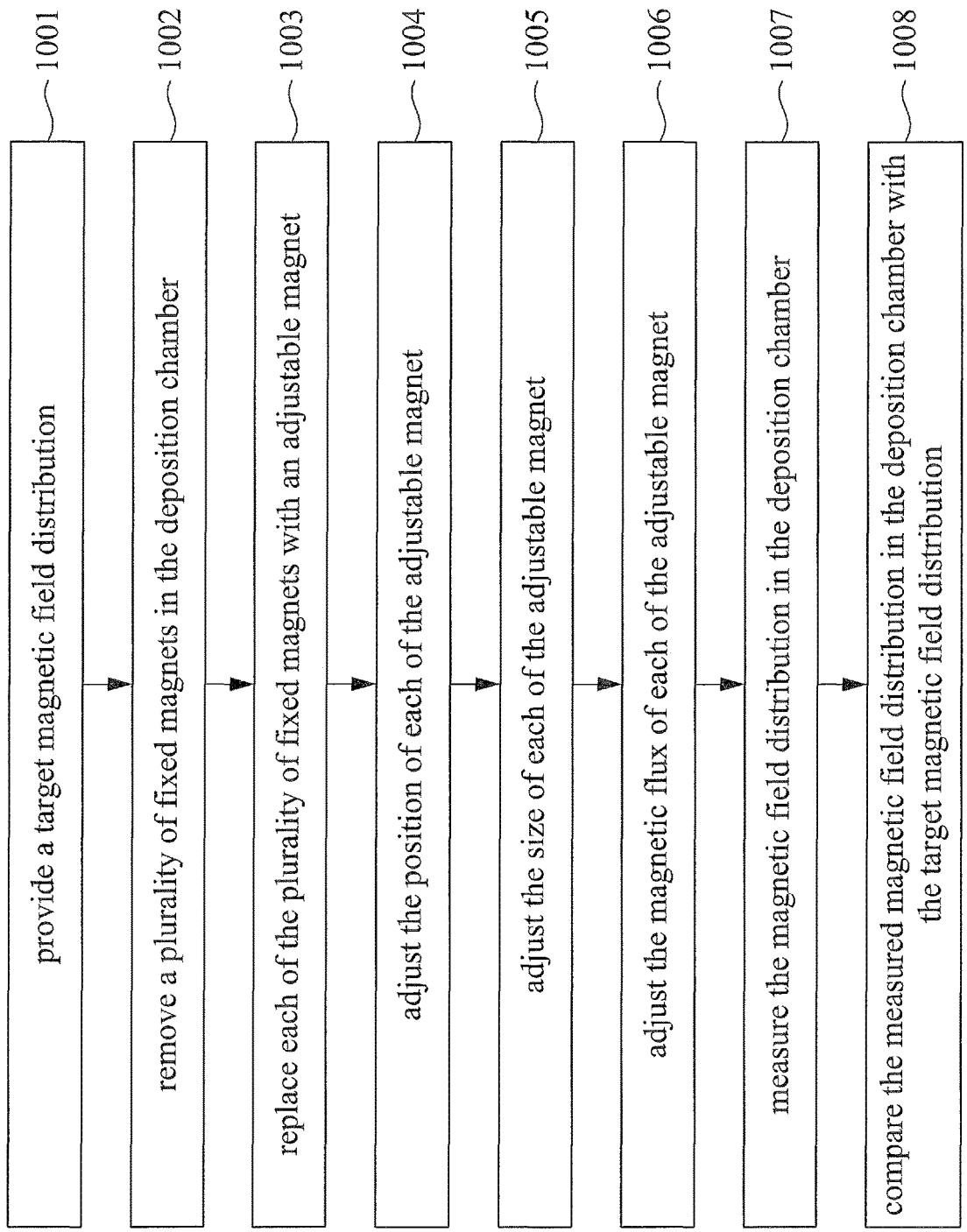
FIG. 10 is flow chart illustrating a method for modifying magnetic field distribution in a deposition chamber, in accordance with some embodiments.

FIG. 10 is flow chart illustrating a method for modifying magnetic field distribution in a deposition chamber, in accordance with some embodiments. According to some embodiments, a method for modifying magnetic field distribution in a deposition chamber includes a first operation 1001 of providing a target magnetic field distribution, a second operation 1002 of removing a plurality of fixed magnets in the deposition chamber, a third operation 1003 of replacing each of the plurality of fixed magnets with a respective magnet having a different configuration, a fourth operation 1004 of adjusting the position of each of the adjustable magnet, according to some embodiments, by adjusting the corresponding screws in the upper and lower connectors of the magnet bodies, a fifth operation 1005 of adjusting the size of each of the adjustable magnet, a sixth operation 1006 of adjusting the magnetic flux of each of the adjustable magnet, according to some embodiments, by adjusting the dimension of the magnet body, or according to some embodiments, by implementing a magnet with different field strength, a seventh operation 1007 of measuring the magnetic field distribution in the deposition chamber, according to some embodiments, by implementing a plurality of magnetic field sensors, for example, and an eighth operation 1008 of comparing the measured magnetic field distribution in the deposition chamber with the target magnetic field distribution.

According to some embodiments, a method for modifying a magnetic field distribution in a deposition chamber is disclosed. The method includes the operations of: providing a target magnetic field distribution, removing a first plurality of fixed magnets in the deposition chamber, replacing each of the first plurality of fixed magnets with respective ones of a second plurality of magnets, performing at least one of adjusting a position of at least one of the second plurality of the magnets, and adjusting a size of at least one of the second plurality of magnets, measuring the magnetic field distribution in the deposition chamber, and comparing the measured magnetic field distribution in the deposition chamber with the target magnetic field distribution.

According to some embodiments, the method further comprises based on the comparison, providing feedback information for adjusting each of the plurality of adjustable magnet. According to some embodiments, the method further comprises based on the feedback information, performing for a second time of at least one of adjusting the position of at least one of the second plurality of magnets, and adjusting the size of at least one of the second plurality of magnets. According to some embodiments, the method further comprises measuring the magnetic field distribution in the deposition chamber again. According to some embodiments, the method further comprises comparing the measured magnetic field distribution in the deposition chamber with the target magnetic field distribution again. According to some embodiments, the method further comprises based on the comparison, providing feedback information for adjusting each of the plurality of adjustable magnet. According to some embodiments, the method further comprises based on the feedback information, performing for a third time of at least one of adjusting the position of at least one of the second plurality of magnets, and adjusting the size of at least one of the second plurality of magnets. According to some embodiments, the method further comprises measuring the magnetic field distribution in the deposition chamber again. According to some embodiments, the method further comprises fixing at least one of the position of at least one of the second plurality of magnets, and the size of at least one of the second plurality of magnets.

According to some embodiments, a deposition chamber is disclosed. The deposition chamber includes a plurality of adjustable magnets for adjusting a magnetic field distribution of the deposition chamber, a position of each of the adjustable magnets is individually adjustable, a volume of each of the plurality of adjustable magnets is individually adjustable, a magnetic field strength of each of the adjustable magnets is individually adjustable. According to some embodiments, the position of each of the adjustable magnets is adjusted vertically. According to some embodiments, the position of each of the adjustable magnets is adjusted vertically by adjusting screws. According to some embodiments the volume of each of the adjustable magnets is adjusted by adjusting the diameter of the corresponding magnet. According to some embodiments, the magnetic field strength of each of the adjustable magnets is adjusted by adjusting the magnet field strength of the corresponding magnet.

According to some embodiments, an adjustable magnet is disclosed. The adjustable electric magnet includes a cylindrical metal body for conducting magnet flux, wherein a diameter of the cylindrical metal body is adjustable, a height of the cylindrical metal body is adjustable, a top adjustable connector for adjusting a position of the adjustable electric magnet, and a bottom adjustable connector for adjusting the position of the adjustable electric magnet. According to some embodiments, the adjustable magnet further includes a plurality of metal coils for generating an electro-magnetic field, an adjustable current source for adjusting the electric current flowing in the plurality of metal coils. According to some embodiments, the adjustable current source for adjusting the electric current flowing in the plurality of metal coils is a current source with at least one adjustable resister. According to some embodiments, the top adjustable connector for adjusting the position of the adjustable electric magnet is a screw. According to some embodiments, the bottom adjustable connector for adjusting the position of the adjustable electric magnet is a screw. According to some embodiments, the adjustable electric magnet further includes a top fastener for fixing the position of the adjustable electric magnet. According to some embodiments, the adjustable electric magnet further includes a bottom fastener for fixing the position of the adjustable electric magnet. According to some embodiments, the top fastener is a screw. According to some embodiments, the bottom fastener is a screw.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   removing a first plurality of fixed magnets in a magnetron of a deposition chamber;
   replacing each of the first plurality of fixed magnets with respective ones of a second plurality of adjustable magnets;
   vertically adjusting a position of at least one of the second plurality of magnets in the magnetron by adjusting an upper screw on the at least one magnet and a lower screw under the at least one magnet;
   measuring a magnetic field distribution in the deposition chamber; and
   comparing the measured magnetic field distribution in the deposition chamber with a target magnetic field distribution.

2. The method of claim 1, further comprising:
   based on the comparison, providing feedback information for adjusting each of the plurality of adjustable magnets.

3. The method of claim 2, further comprising:
   based on the feedback information, for a second time vertically adjusting the position of at least one of the second plurality of magnets, and adjusting a diameter of at least one of the second plurality of magnets.

4. The method of claim 3, further comprising:
   measuring the magnetic field distribution in the deposition chamber again.

5. The method of claim 4, further comprising:
   comparing again the measured magnetic field distribution in the deposition chamber with the target magnetic field distribution.

6. The method of claim 5, further comprising:
   based on the comparison, providing again feedback information for adjusting each of the plurality of adjustable magnet.

7. A deposition chamber, comprising:
   a magnetron; and
   a plurality of adjustable magnets in the magnetron for adjusting a magnetic field distribution of the deposition chamber,
   wherein a volume of each of the plurality of adjustable magnets is individually adjustable by adjusting a diameter of the corresponding magnet in the magnetron, and
   wherein each of the adjustable magnets is configured to be adjusted vertically by adjusting a top adjustable connector on the adjustable magnet and a bottom adjustable connector under the adjustable magnet.

8. The deposition chamber of claim 7, wherein a magnetic field strength of each of the adjustable magnets is individually adjustable.

9. The deposition chamber of claim 8, wherein:
   a first subset of adjustable magnets in the plurality of adjustable magnets are selected to be adjusted to reduce their magnetic field strengths; and
   a second subset of adjustable magnets in the plurality of adjustable magnets are selected to be adjusted to increase their magnetic field strengths.

10. The deposition chamber of claim 7, wherein each of the top adjustable connector and the bottom adjustable connector is a screw.

11. An adjustable magnet, comprising:
    a cylindrical metal body for conducting magnet flux, wherein a diameter of the cylindrical metal body is adjustable;
    an upper screw configured for adjusting the adjustable magnet vertically; and
    a lower screw configured for adjusting the adjustable magnet vertically.

12. The adjustable magnet of claim 11, wherein the adjustable magnet is an electric adjustable magnet.

13. The adjustable magnet of claim 12, further comprising:
    a plurality of metal coils for generating an electro-magnetic field; and
    an adjustable current source for adjusting the electric current flowing in the plurality of metal coils.

14. The adjustable magnet of claim 13, wherein the adjustable current source for adjusting the electric current flowing in the plurality of metal coils is a current source with at least one adjustable resister.

15. The adjustable magnet of claim 13, wherein a height of the cylindrical metal body is adjustable.

16. The adjustable magnet of claim 13, wherein the adjustable magnet is adjusted vertically by the upper screw and the lower screw coupling the adjustable magnet to a fixing spot of a magnetron.

17. The adjustable magnet of claim 13, further comprising a top fastener for fixing a position of the adjustable magnet.

18. The adjustable magnet of claim 13, further comprising a bottom fastener for fixing a position of the adjustable magnet.

19. The adjustable magnet of claim 17, wherein the top fastener is a screw.

20. The adjustable magnet of claim 18, wherein the bottom fastener is a screw.

* * * * *